(12) United States Patent
Huang

(10) Patent No.: US 12,267,073 B2
(45) Date of Patent: Apr. 1, 2025

(54) OSCILLATION DEVICE AND METHOD FOR OSCILLATION THEREOF

(71) Applicant: Seer Microelectronics, Inc., Hsinchu County (TW)

(72) Inventor: Ming-Feng Huang, Hsinchu County (TW)

(73) Assignee: SEER MICROELECTRONICS, INC., Hsinchu County (TW)

( * ) Notice: Subject to any disclaimer, the term of this patent is extended or adjusted under 35 U.S.C. 154(b) by 0 days.

(21) Appl. No.: 18/510,759

(22) Filed: Nov. 16, 2023

(65) Prior Publication Data
US 2024/0223165 A1 Jul. 4, 2024

Related U.S. Application Data

(60) Provisional application No. 63/383,994, filed on Nov. 16, 2022.

(51) Int. Cl.
*H03K 3/03* (2006.01)

(52) U.S. Cl.
CPC .................. *H03K 3/0322* (2013.01)

(58) Field of Classification Search
CPC ..... H03K 3/0322; H03K 3/0315; H03K 3/014
See application file for complete search history.

(56) References Cited

U.S. PATENT DOCUMENTS

| | | | | |
|---|---|---|---|---|
| 5,942,947 A * | 8/1999 | Bhagwan | ................ | H03L 7/085 331/10 |
| 6,462,623 B1 * | 10/2002 | Horan | .................. | H03K 3/0231 331/25 |
| 9,490,778 B1 * | 11/2016 | Ho | ....................... | H03K 3/0322 |
| 10,797,713 B1 | 10/2020 | Venkatesan et al. | | |
| 11,424,751 B1 | 8/2022 | Tsai et al. | | |
| 2010/0134170 A1 * | 6/2010 | Wang | ................... | H03K 3/0322 327/288 |

(Continued)

FOREIGN PATENT DOCUMENTS

| CN | 113054951 A | 6/2021 |
|---|---|---|
| TW | 201101689 A | 1/2011 |

OTHER PUBLICATIONS

Li, Design of Low Power CMOS Ring Voltage Controlled Oscillator with Temperature Compensation, Sep. 16, 2015, https://m.fx361.com/news/2015/0916/808114.html.

(Continued)

*Primary Examiner* — Jeffrey M Shin
(74) *Attorney, Agent, or Firm* — WPAT, PC

(57) ABSTRACT

The present application discloses an oscillation device and a method for oscillation thereof, in which a control signal is generated from a control circuit to a ring oscillation circuit. The ring oscillation circuit generates an oscillation signal with a first signal frequency at start up oscillation, firstly. Further, the ring oscillation circuit modulates an oscillation frequency to drive the oscillation signal change from the first signal frequency to a higher second signal frequency. Thus, the present application provides the ring oscillation device generating the oscillation signal with a lower frequency at starting up oscillation, and then make the oscillation signal change to a higher frequency. Hereby, the present application provides the oscillation signal operated at a higher operating frequency.

10 Claims, 10 Drawing Sheets

(56) References Cited

U.S. PATENT DOCUMENTS

| | | | |
|---|---|---|---|
| 2011/0210798 A1 | 9/2011 | Koh et al. | |
| 2012/0098604 A1* | 4/2012 | Lee | H03K 3/011 331/57 |
| 2016/0065220 A1 | 3/2016 | Rana et al. | |
| 2022/0321107 A1* | 10/2022 | Furuta | H03K 5/15046 |

OTHER PUBLICATIONS

Taiwan Intellectual Property Office, Official action Search report on Aug. 5, 2024.

* cited by examiner

OSCILLATION DEVICE AND METHOD FOR OSCILLATION THEREOF

FIELD OF THE INVENTION

The present application related to an electronic device and a method thereof, in particular to an oscillation device and a method for oscillation thereof.

BACKGROUND OF THE INVENTION

With the evolution of science and technology, electronic devices have developed into more diversified application designs according to life needs in order to improve the safety, convenience, and entertainment of life.

Oscillators are widely used in electronic devices to provide clock signals to synchronize various electronic components in the electronic devices on the clock cycle. For example, processing units (such as CPUs, MCUs, etc.) and memories are based on the output of the oscillator. The oscillation signal is used as a clock signal to allow the processing unit to synchronize the memory in the clock cycle and is used for data access and data calculation. In addition to data processing between electronic components, they are also used in communication transmission. For example: an oscillator is used as a local oscillation source of a communication system. It is used for signal transmission based on an oscillation signal with a fixed frequency output by the local oscillation source. The applications include wireless signal transmission between wireless communication devices or network signal transmission between network devices.

Nonetheless, the existing method of starting the oscillation signal is generally direct oscillation, inducing a risk of failure to oscillate. Or, in order to avoid failure to oscillate, the operating frequency of the oscillator is limited, resulting in poor performance of the oscillator. Besides, the operating frequency may not be set high.

Accordingly, the limited operating frequency and the starting of oscillation are currently urgent problems for electronic device manufacturers.

SUMMARY OF THE INVENTION

An objective of the present application is to provide an oscillation device and a method for oscillation thereof. A ring oscillation circuit generates an oscillation signal with a first signal frequency. The oscillation signal is then driven to become from the first signal frequency to a second signal frequency according to a control signal, and the second signal frequency is higher than the first signal frequency. Thereby, the problems of limited operating frequency and the starting of oscillation may be improved.

To achieve the above objective, the present application provides an oscillation device, which comprises a control circuit and a ring oscillation circuit. The control circuit generates a control signal to the ring oscillation circuit. The ring oscillation circuit generates an oscillation signal with a first signal frequency and drives the oscillation signal to become from the first signal frequency to a second signal frequency according to the control signal, and the second signal frequency is higher than the first signal frequency. Thereby, the oscillation device according to the present application may start oscillation at a lower frequency. After the oscillation signal is stabilized, the frequency of the oscillation signal may further become a higher frequency. Consequently, the problems of the starting of oscillation and limited operating frequency may be improved.

The present application further provides a method for oscillation of an oscillation device. First, a ring oscillation circuit is driven to generate an oscillation signal with a first signal frequency. Next, the ring oscillation circuit is driven to become frequency of the oscillation signal from the first signal frequency to a second signal frequency, where the second signal frequency is higher than the first signal frequency. Thereby, the oscillation device according to the present application may start oscillation at a lower frequency. After the oscillation signal is stabilized, the frequency of the oscillation signal may further become a higher frequency. Consequently, the problems of the starting of oscillation and limited operating frequency may be improved.

DETAILED DESCRIPTION OF THE INVENTION

In order to make the structure and characteristics as well as the effectiveness of the present application to be further understood and recognized, the detailed description of the present application is provided as follows along with embodiments and accompanying figures.

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to". Besides, the word "couple" comprises any direct and indirect electrical connection. Thereby, if the description is that a first device is coupled to a second device, it means that the first device is connected electrically to the second device directly, or the first device is connected electrically to the second device via other device or connecting means indirectly.

To solve the problems of limited operating frequency and the starting of oscillation in the oscillators according to the prior art, the present application proposes an oscillation device and the method for oscillation thereof. The present application provides a control circuit to generate a control signal to a plurality of delay cells. When the control signal is not outputted, the plurality of delay cells are driven to generate an oscillation signal oscillating at a first signal frequency for starting oscillation. Next, when the control signal is outputted, the plurality of delay cells drive the oscillation signal to oscillation at a second signal frequency. The second signal frequency is higher than the first signal frequency. Accordingly, the oscillation device according to the present application may start oscillation at a lower frequency according to the oscillation signal. After the oscillation signal is stabilized, the frequency of the oscillation signal may further become a higher frequency. Consequently, the problems of the starting of oscillation and limited operating frequency may be avoided.

In the following description, various embodiments of the present application are described using figures for describing the present application in detail. Nonetheless, the concepts of the present application may be embodied by various forms. Those embodiments are not used to limit the scope and range of the present application.

Figure 1:
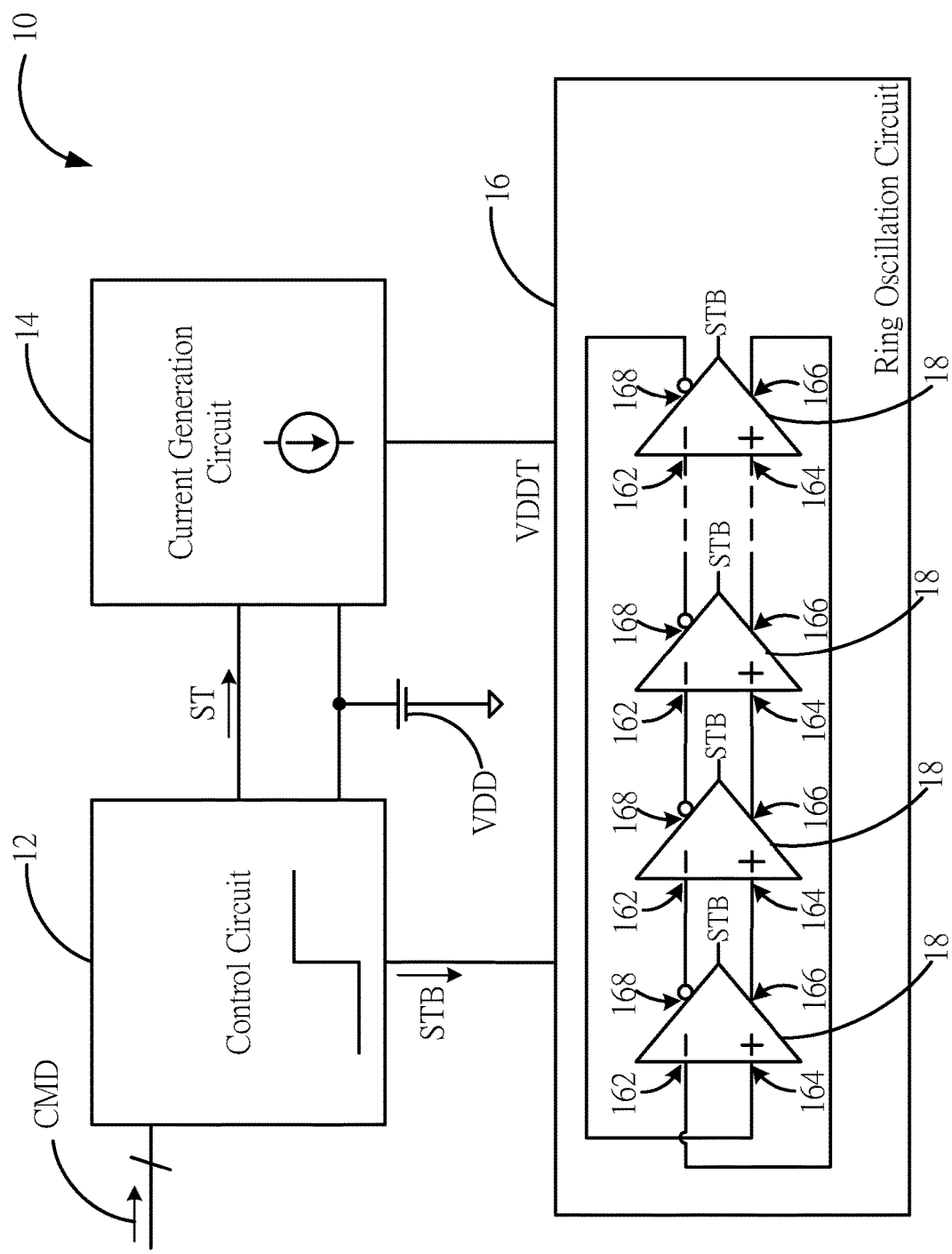
FIG. 1 shows a block diagram of the oscillation device according to an embodiment of the present application.

First, please refer to FIG. 1, which shows a block diagram of the oscillation device according to an embodiment of the present application. As shown in the figure, the oscillation device 10 according to the present application comprises a control circuit 12, a current generation circuit 14, and a ring oscillation circuit 16. The control circuit 12 is coupled to the current generation circuit 14 and the ring oscillation circuit 16. The control circuit 12 generates a control signal STB to the ring oscillation circuit 16. The ring oscillation circuit 16 generates an oscillation signal according to the control signal STB.

Furthermore, the ring oscillation circuit 16 comprises a plurality of delay cells 18. The plurality of delay cells 18 are coupled to the previous delay cell 18 via a first input terminal 162 and a second input terminal 164, respectively, and to the next delay cell 18 via a first output terminal 166 and a second output terminal 168, respectively. Particularly, the plurality of delay cells 18 are coupled to the second output terminal 168 of the previous delay cell 18 via the first input terminal 162, respectively, and to the first output terminal 166 of the previous delay cell 18 via the second input terminal 164, respectively. The second output terminal 168 of the delay cell 18 of the final stage in the ring oscillation circuit 16 is connected to the second input terminal 164 of the delay cell 18 of the first stage. The first output terminal 166 of the delay cell 18 of the final stage in the ring oscillation circuit 16 is connected to the first input terminal 162 of the delay cell 18 of the first stage.

Figure 2:
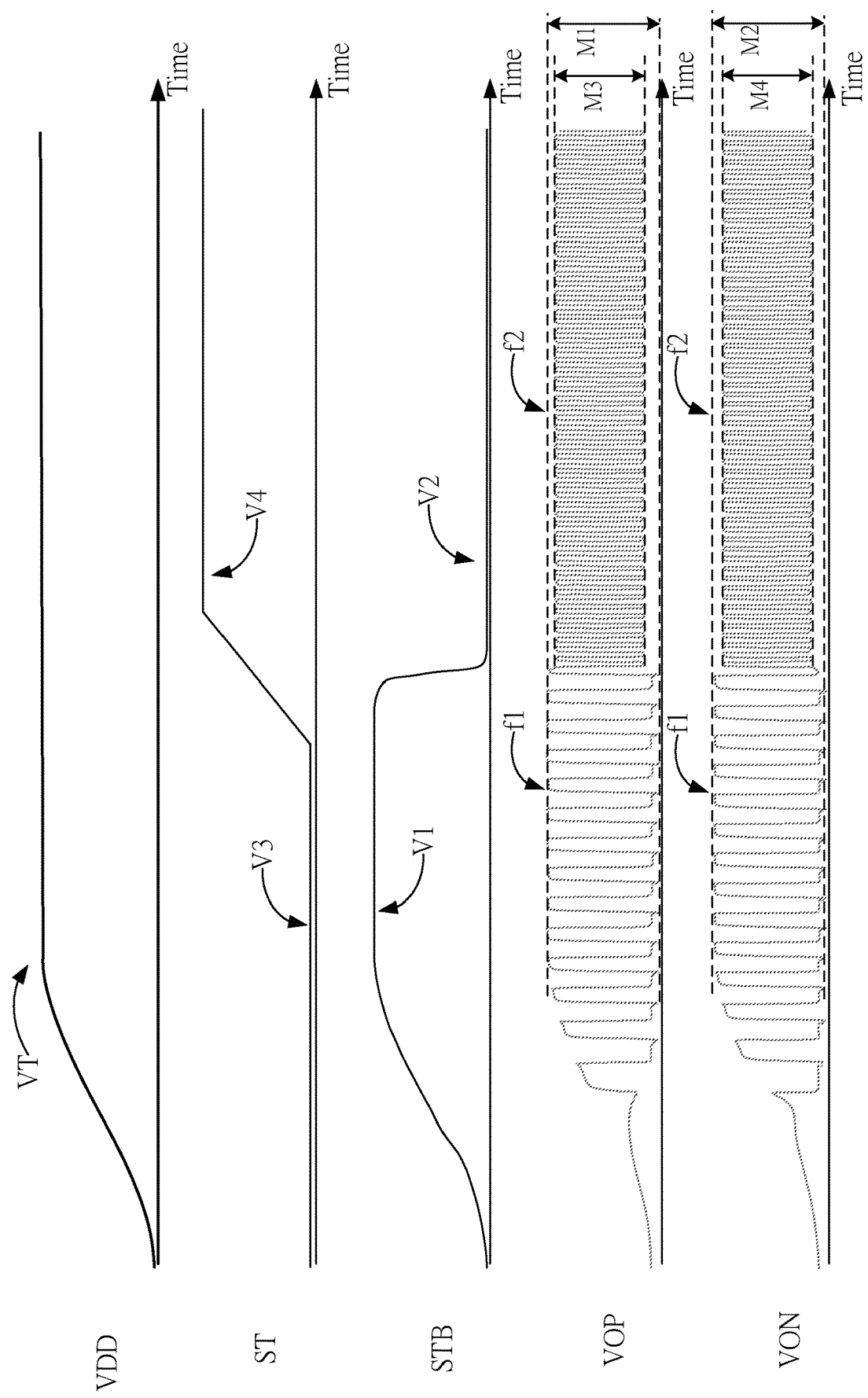
FIG. 2 shows a schematic diagram of the signals according to the present application.

FIG. 2 shows a schematic diagram of the signals according to the present application. As shown in the figure, according to the present embodiment, a first output signal VOP and a second output signal VON are examples of the oscillation signal. The first output signal VOP and the second output signal VON are mutually inverted and generated by the first output terminal 166 and the second output terminal 168, respectively. Thereby, an external circuit may use the first output signal VOP or the second output signal VON as a clock reference signal. When a supply voltage VDD starts to be supplied, the waveform of the supply voltage VDD shows that its voltage level starts to rise until a supply voltage level VT. When the supply voltage VDD starts to be supplied, the ring oscillation circuit 16 generates the first output signal VOP and the second output signal VON correspondingly with both oscillating at a first signal frequency f1. In other words, the ring oscillation circuit starts to oscillate and generates the first output signal VOP and the second output signal VON with the first signal frequency f1. Next, the control circuit 12 generates said control signal STB to the ring oscillation circuit 16 and thus driving the frequency of the first output signal VOP and the second output signal VON to become from the first signal frequency f1 to a second signal frequency f2.

Figure 3:
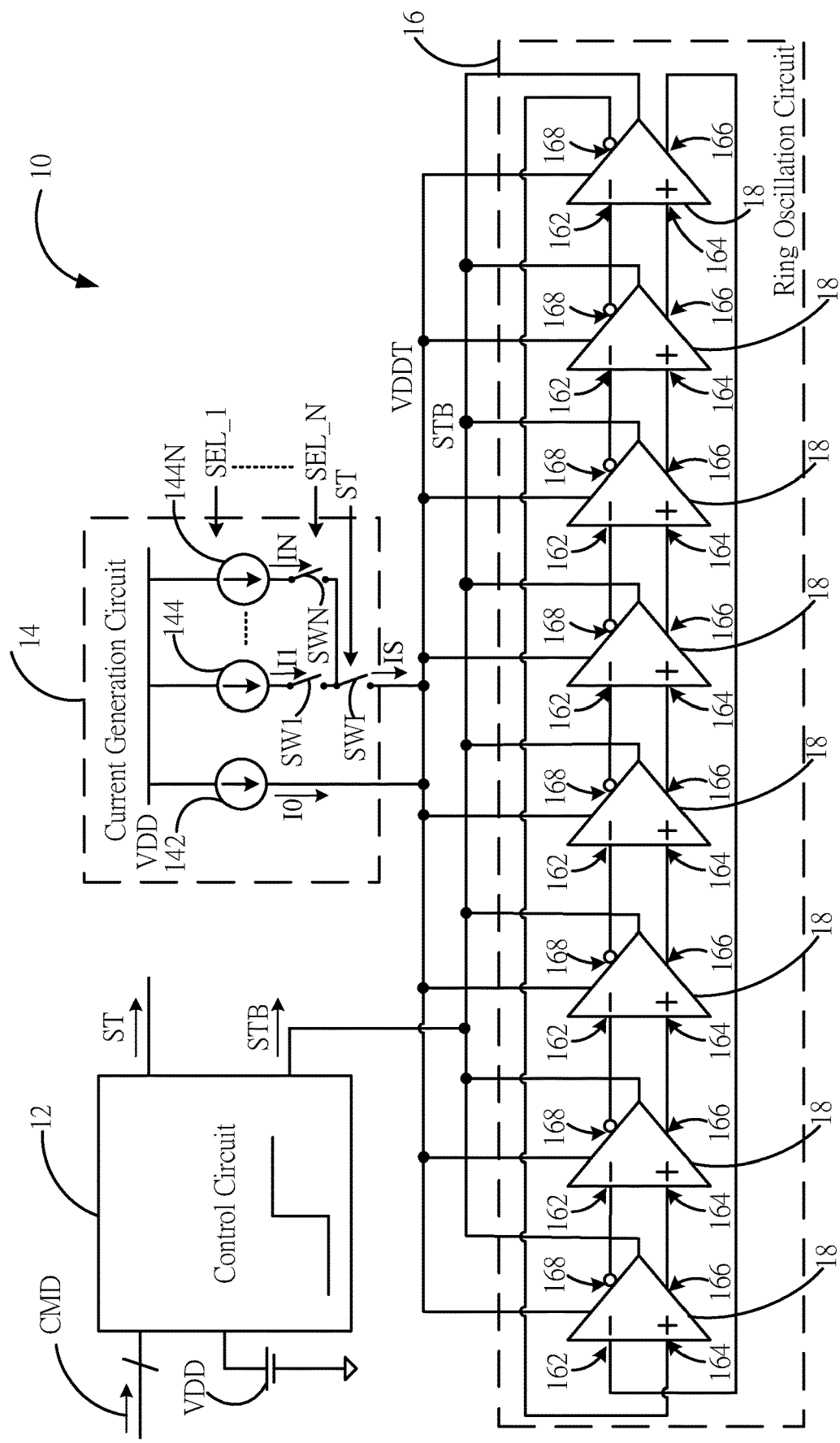
FIG. 3 shows a circuit diagram of the oscillation device according to an embodiment of the present application.

Moreover, please refer to FIG. 3, which shows a circuit diagram of the oscillation device according to an embodiment of the present application. As shown in the figure, the current generation circuit 14 comprises a first current source 142 and one or more second current source 144. According to the present embodiment, a plurality of second current sources 144 are adopted, including second current sources 144 to 144N. Please refer again to FIG. 2 to FIG. 4. The control circuit 12 generates a current control signal ST to the current generation circuit 14. The current generation circuit 14 generates a first current I0 and second current I1 to N-th current IN according to the supply voltage VDD. To elaborate, the first current source 142 generates the first current I0 to the plurality of delay cells 18. Thereby, in addition to generating the first output signal VOP and the second output signal VON according to the control signal STB, the plurality of delay cells 18 further generate the first output signal VOP and the second output signal VON according to the first current I0. The first current I0 is used for supplying a driving voltage VDDT to the plurality of delay cells 18.

The current control signal ST controls a current switch SWI between the plurality of second current sources 144~144N and the plurality of delay cells 18. When the current switch SWI is closed, the first current I0 and the second current I1 to the N-th current are used to supply the driving voltage VDDT. In other words, when the current control signal ST drives the current switch SWI to close, the driving voltage VDDT will be increased for driving the plurality of delay cells 18 to generate the first output signal VOP and the second output signal VON more rapidly. In addition, the current generation circuit 14 may further use a first select signal SEL_1 to a N-th select signal SEL_N to control the second current sources 144~144N to supply the second current I1 to the N-th current IN and thus changing the current flowing through the current switch SWI. Namely, by changing a conduction current IS, the driving voltage VDDT will be adjusted correspondingly. Then the plurality of delay cells 18 are driven to generate the first output signal VOP and the second output signal VON more rapidly.

Figure 4:
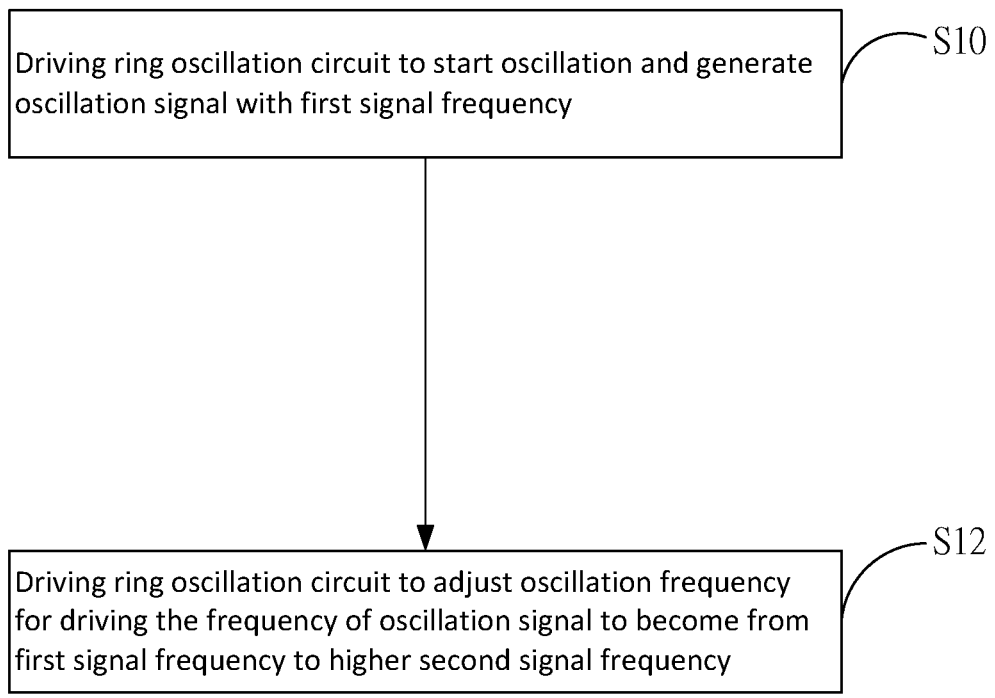
FIG. 4 shows a flowchart of the oscillation method for the oscillation device according to an embodiment of the present application.

Please refer to FIG. 4, which shows a flowchart of the oscillation method for the oscillation device according to an embodiment of the present application. As shown in the figure, the method for oscillation of the oscillation device according to the present embodiment comprises the following steps:

Step S10: Driving ring oscillation circuit to start oscillation and generate oscillation signal with first signal frequency; and Step S12: Driving ring oscillation circuit to adjust oscillation frequency for driving frequency of oscillation signal to become from first signal frequency to higher second signal frequency.

In the following, the steps of the method for oscillation of the oscillation device 10 according to the present application will be further illustrated.

In the step S10, by referring again to FIG. 2 to FIG. 4, it is known that the control circuit 12 is coupled to a supply voltage VDD. Thereby, when the oscillation device 10 starts, the supply voltage VDD is raised to the supply voltage level VT. Then the control circuit 12 starts to generate the control signal STB and the control signal STB is raised to a first voltage level V1 gradually. At this moment, the control circuit 12 does not control the ring oscillation circuit 16 according to the control signal STB. The ring oscillation circuit 16 starts to oscillate and generates the first output signal VOP and the second output signal VON with the first signal frequency f1. Besides, the first output signal VOP and the second output signal VON with the first signal frequency f1 oscillate at full amplitude. That is to say, the first output signal VOP and the second output signal VON oscillate at a first amplitude M1 and a second amplitude M2, respectively.

In the step S12, as shown in FIG. 2 to FIG. 4, the control circuit 12 generates the control signal STB to the ring oscillation circuit 16 according to a control command CMD for driving the ring oscillation circuit 16 to become the frequency of the first output signal VOP and the second output signal VON from the first signal frequency f1 to a second signal frequency f2, and the second signal frequency f2 is higher than the first signal frequency f1. Thereby, the density in the waveforms of the first output signal VOP and the second output signal VON with the first signal frequency f1 will appear looser than with the second signal frequency f2. To elaborate, the control circuit 12 outputs the control signal STB with level change to the ring oscillation circuit 16 for driving the first output signal VOP and the second output signal VON generated by the ring oscillation circuit 16 to become the waveforms, namely, changing the signal frequency of the first output signal VOP and the second output signal VON from the first signal frequency f1 to the second signal frequency f2, for example, from 3 MHz to 10 MHz.

In addition, the first output signal VOP and the second output signal VON with the second signal frequency f2 oscillate at non-full amplitude. That is to say, the first output signal VOP and the second output signal VON oscillate at a third amplitude M3 and a fourth amplitude M4, respectively. The control command CMD may be generated by an external controller, such as a controller implemented by an SOC digital circuit, an FPGA, or a microcontroller (MCU). The waveform of the first output signal VOP and the second output signal VON as described above is only an example. Alternatively, the first output signal VOP and the second output signal VON may oscillate completely at full amplitude or non-full amplitude. Alternatively, the first output signal VOP and the second output signal VON may oscillate at non-full amplitude first and then at full amplitude subsequently.

Please refer to FIG. 3 again. The plurality of delay cells 18 are coupled to the control circuit 12, respectively. Thereby, the control signal STB may be transmitted to the plurality of delay cells 18, respectively. Then the control signal STB may control the plurality of delay cells 18 to convert the signal frequency of the output signals, respectively, namely, changing the frequency of the first output signal VOP and the second output signal VON. Besides, the plurality of delay cells 18 are further coupled to the current generation circuit 14. The first current source 142 of the current generation circuit 14 is also coupled to the plurality of delay cells 18, respectively. The current switch SWI of the current generation circuit 14 is further coupled to the plurality of delay cells 18, respectively, for controlling the conduction of the second current I1 to the N-th current IN flowing to the plurality of delay cells 18. In other words, the conduction current IS flowing through the current switch SWI may be controlled.

The above description illustrates the connection between the control circuit 12 and the ring oscillation circuit 16 and the technical method to convert the oscillation signal, namely, the technical method to drive the first output signal VOP and the second output signal VON to change the signal frequency.

In the following embodiment, an embodiment of a single delay cell 18 along with the accompanying control signal STB and the current generation circuit 14 will be described in detail.

Figure 5:
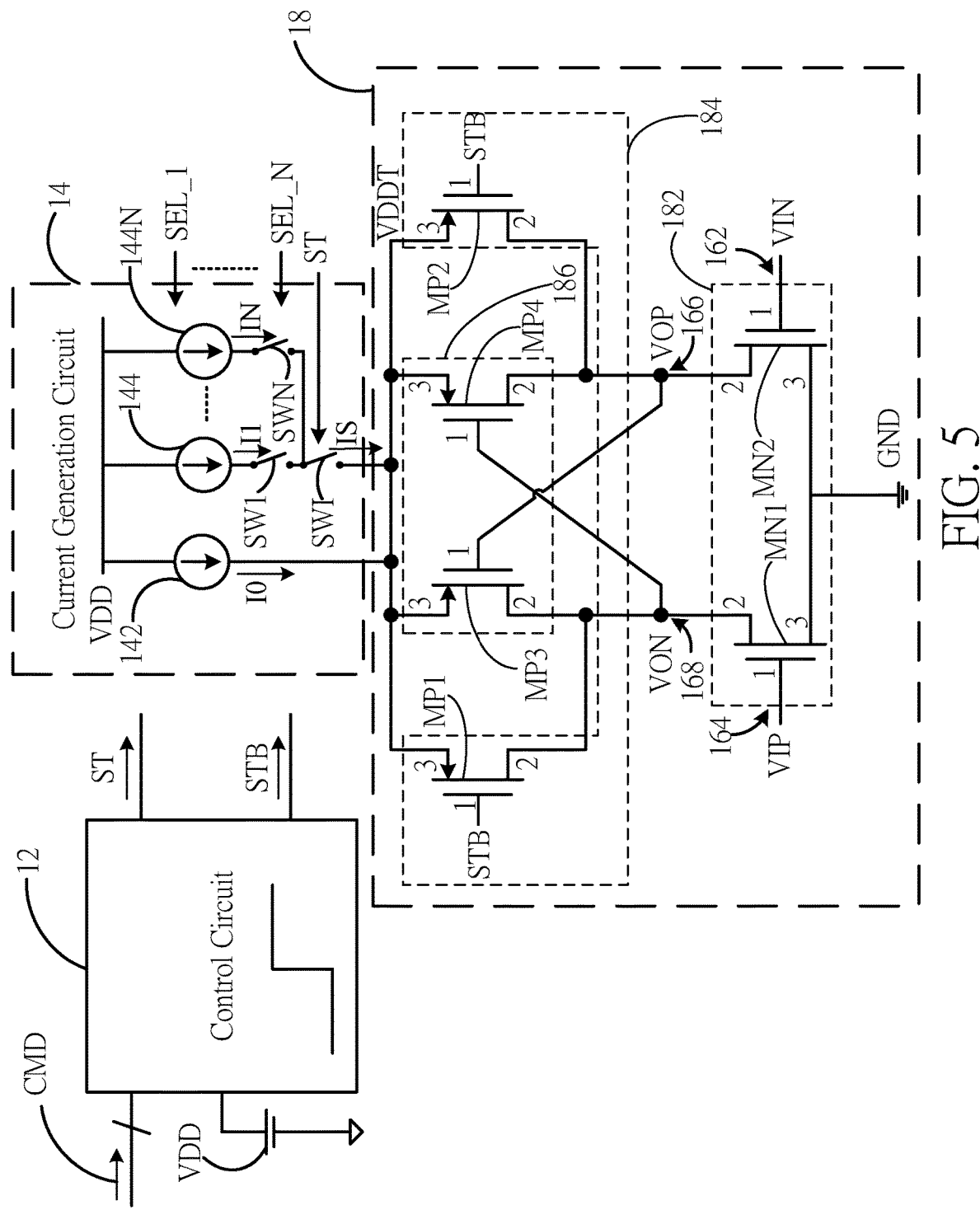
FIG. 5 shows a circuit diagram of a current generation circuit and a single delay cell according to an embodiment of the present application.

Please refer to FIG. 5, which shows a circuit diagram of the current generation circuit and a single delay cell according to an embodiment of the present application. As shown in the figure, the single delay cell 18 of the ring oscillation circuit 16 according to the present application comprises an input differential pair 182, a step-controlled pair circuit 184, and a cross couple pair 186. The input differential pair 182 is coupled to a ground GND and to the first input terminal 162, the second input terminal 164, the first output terminal 166, and the second output terminal 168 for receiving a first input signal VIN and a second input signal VIP via the first input terminal 162 and the second input terminal 164, respectively, and outputting a first output signal VOP and a second output signal VON via the first output terminal 166 and the second output terminal 168, respectively. The cross couple pair 186 and the step-controlled pair circuit 184 are coupled in parallel and coupled to the first output terminal 166 and the second output terminal 168, as well as to the current generation circuit 14.

The supply voltage VDD drives the first current source 142 of the current generation circuit 14 to generate the first current I0 for supplying the driving voltage VDDT to the step-controlled pair circuit 184 and the cross couple pair 186. When the control signal STB does not control the step-controlled pair circuit 184 to turn on, the cross couple pair 186 is used for generating the first output signal VOP and the second output signal VON. The input differential pair 182 receives the first input signal VIN and the second input signal VIP via the first input 162 and the second input 164 for controlling the first output 166 and the second output 168 to output the first output signal VOP and the second output signal VON. Thereby, the first input signal VIN and the second input signal VIP control the second output signal VON and the first output signal VOP to oscillate at the first signal frequency f1, respectively.

When the control signal STB controls the step-controlled pair circuit 184 to turn on, the step-controlled pair circuit 184 is coupled to the cross couple pair 186 in parallel. In other words, the driving voltage VDDT will be supplied to the step-controlled pair circuit 184 and the cross couple pair 186 together. Since the signal frequency is inversely proportional to the impedance of the parallel connection of the step-controlled pair circuit 184 and the cross couple pair 186, the first output signal VOP and the second output signal VON will oscillate at the second signal frequency f2. That is to say, when the control signal STB controls the step-controlled pair circuit 184 to turn on, the signal frequency of the first output signal VOP and the second output signal VON is driven to become from the first signal frequency f1 to the second signal frequency f2 with the second signal frequency f2 higher than the first signal frequency f1.

To elaborate, the input differential pair 182 according to the present embodiment comprises a first input transistor MN1 and a second input transistor MN2. The step-controlled pair circuit 184 comprises a first control transistor MP1 and a second control transistor MP2. The cross couple pair 186 comprises a first coupling transistor MP3 and a second coupling transistor MP4. A first terminal of the first input transistor MN1 is coupled to the second input terminal 164. A second terminal of the first input transistor MN1 is coupled to the second output terminal 168. A third terminal of the first input transistor MN1 and a third terminal of the second input transistor MN2 are both coupled to the ground GND. A first terminal of the second input transistor MN2 is coupled to the first input terminal 162. A second terminal of the second input transistor MN2 is coupled to the first output terminal 166.

A first terminal of the first control transistor MP1 and a first terminal of the second control transistor MP2 are coupled to a terminal of the control signal STB. The second terminals of the first control transistor MP1 and the first coupling transistor MP3 and a first terminal of the second coupling transistor MP4 are all coupled to the second output terminal 168. The second terminals of the second control transistor MP2 and the second coupling transistor MP4 and a first terminal of the first coupling transistor MP3 are all coupled to the first output terminal 166. The third terminals of the first control transistor MP1, the second control transistor MP2, the first coupling transistor MP3, and the second coupling transistor MP4 are all coupled to the driving voltage VDDT. The control signal STB controls the turning on and off of first control transistor MP1 and the second control transistor MP2 for determining if the step-controlled pair circuit 184 should be connected in parallel with the cross couple pair 186, which, in turn, determines if the internal resistance of the first control transistor MP1, the second control transistor MP2, the first coupling transistor MP3, and the second coupling transistor MP4 are connected in parallel and if the frequency of the first output signal VOP and the second output signal VON with the first signal frequency f1 should be adjusted. In other words, it should be determined to change the impedance by using parallel connection and thus changing the frequency of the first output signal VOP and the second output signal VON to the second signal frequency f2.

Figure 6:
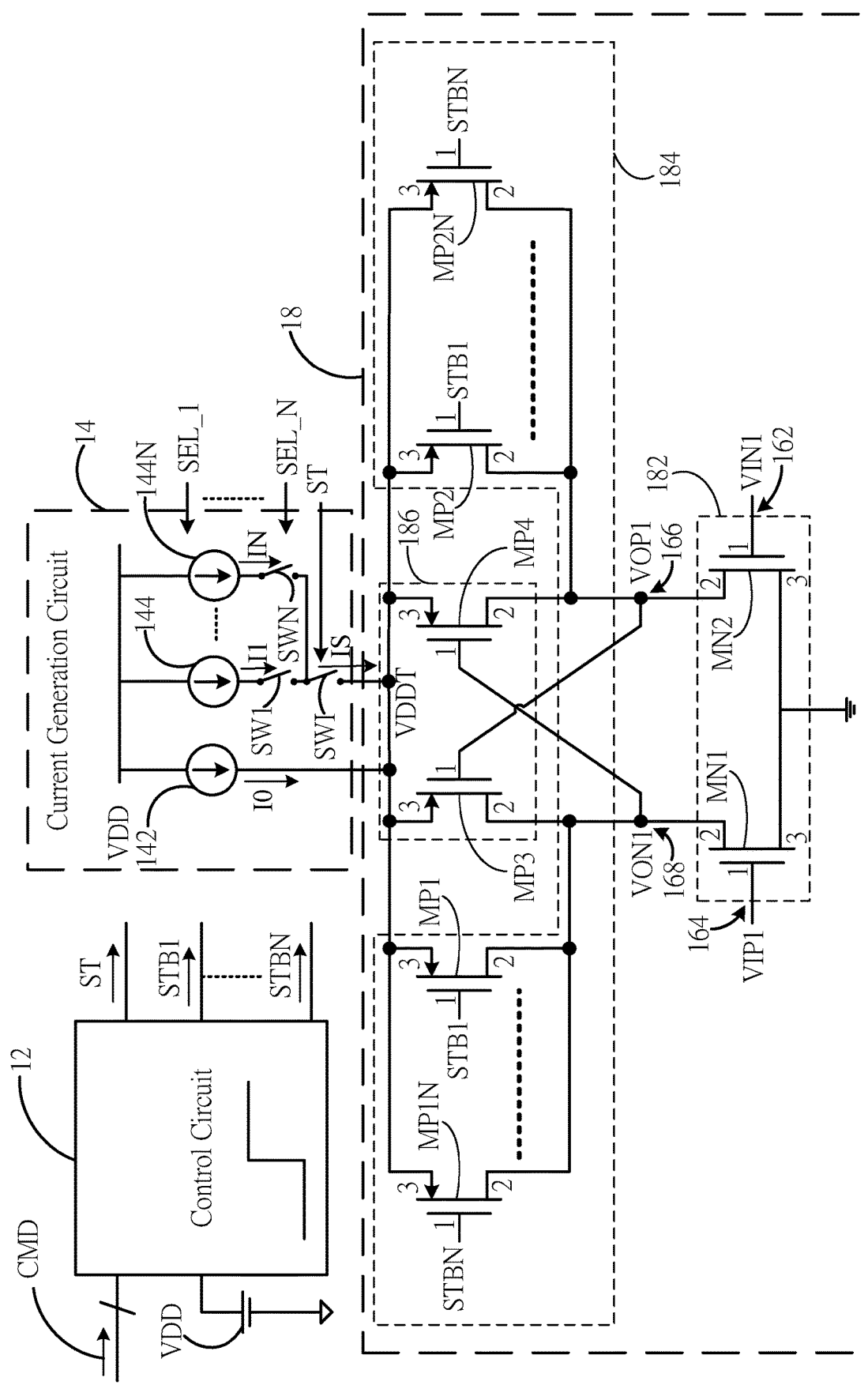
FIG. 6 shows a circuit diagram of the current generation circuit and the single delay cell according to another embodiment of the present application.

Please refer to FIG. 6, which shows a circuit diagram of the current generation circuit and a single delay cell according to another embodiment of the present application. The difference between FIG. 5 and FIG. 6 is that the step-controlled pair circuit 184 in FIG. 5 comprises a step-controlled pair, namely, the first control transistor MP1 and the second control transistor MP2, for controlling the signal frequency of the first output signal VOP and the second output signal VON, while the step-controlled pair circuit 184 in FIG. 6 comprises a plurality of first control transistors MP1~MP1N and a plurality of second control transistors MP2~MP2N. That is to say, the step-controlled pair circuit 184 in FIG. 6 comprises a plurality of step-controlled pairs. Thereby, the step-controlled pair circuit 184 in FIG. 6 is coupled to terminals of a plurality of control signals STB1~STBN for controlling conduction of different step-controlled pairs, respectively, and hence controlling the signal frequency of the first output signal VOP and the second output signal VON. In other words, according to the present embodiment, the signal frequency of the first output signal VOP and the second output signal VON may be adjusted via the plurality of control signals STB1~STBN for changing the signal frequency of the first output signal VOP and the second output signal VON to a different one.

Figure 7:
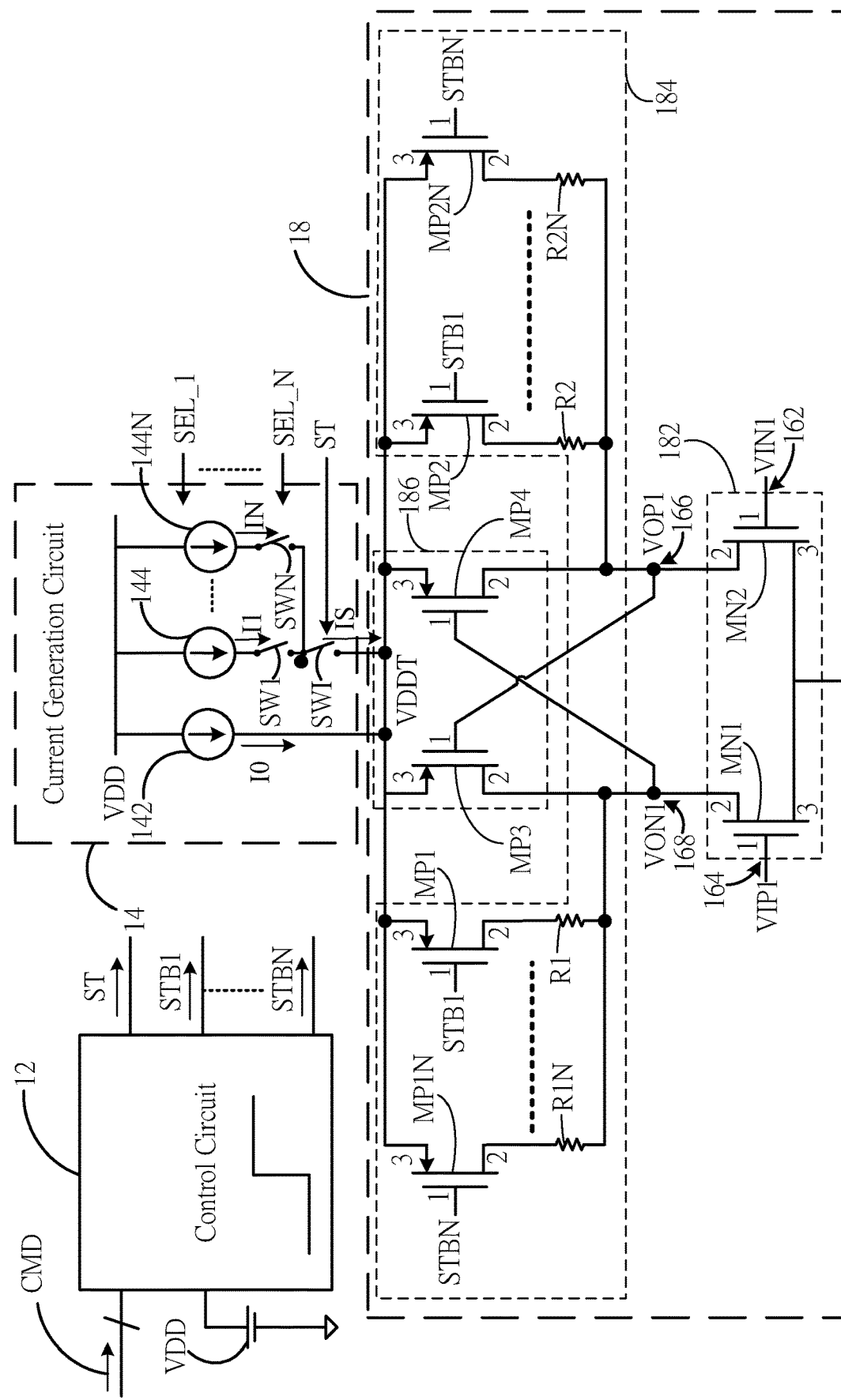
FIG. 7 shows a circuit diagram of the current generation circuit and the single delay cell according to another embodiment of the present application.

Please refer to FIG. 7, which shows a circuit diagram of the current generation circuit and a single delay cell according to another embodiment of the present application. Difference between FIG. 6 and FIG. 7 is that the step-controlled pair circuit 184 in FIG. 7 further comprises a plurality of first resistors R1~R1N and a plurality of second resistors R2~R2N. In addition to connecting the internal resistance of the transistors in the step-controlled pair circuit 184 in parallel with the cross couple pair 186, the plurality of step-controlled pairs in the step-controlled pair circuit 184 are further connected to a pair of resistors in series, respectively. Namely, each transistor in each step-controlled pair is connected to a resistor in series for increasing the impedance of parallel connection when the internal resistance of the step-controlled pair circuit 184 is connected to the cross couple pair 186 in parallel. To elaborate, the plurality of first control transistors MP1~MP1N and the plurality of second control transistors MP2~MP2N are coupled to a resistor, respectively. In other words, the plurality of first control transistors MP1~MP1N are coupled to the plurality of first resistors R1~R1N in series and the plurality of second control transistors MP2~MP2N are coupled to the plurality of second resistors R2~R2N in series. Thereby, the impedance of parallel connection may be increased when the internal resistance of the step-controlled pair circuit 184 is connected to the cross couple pair 186 in parallel.

Figure 8:
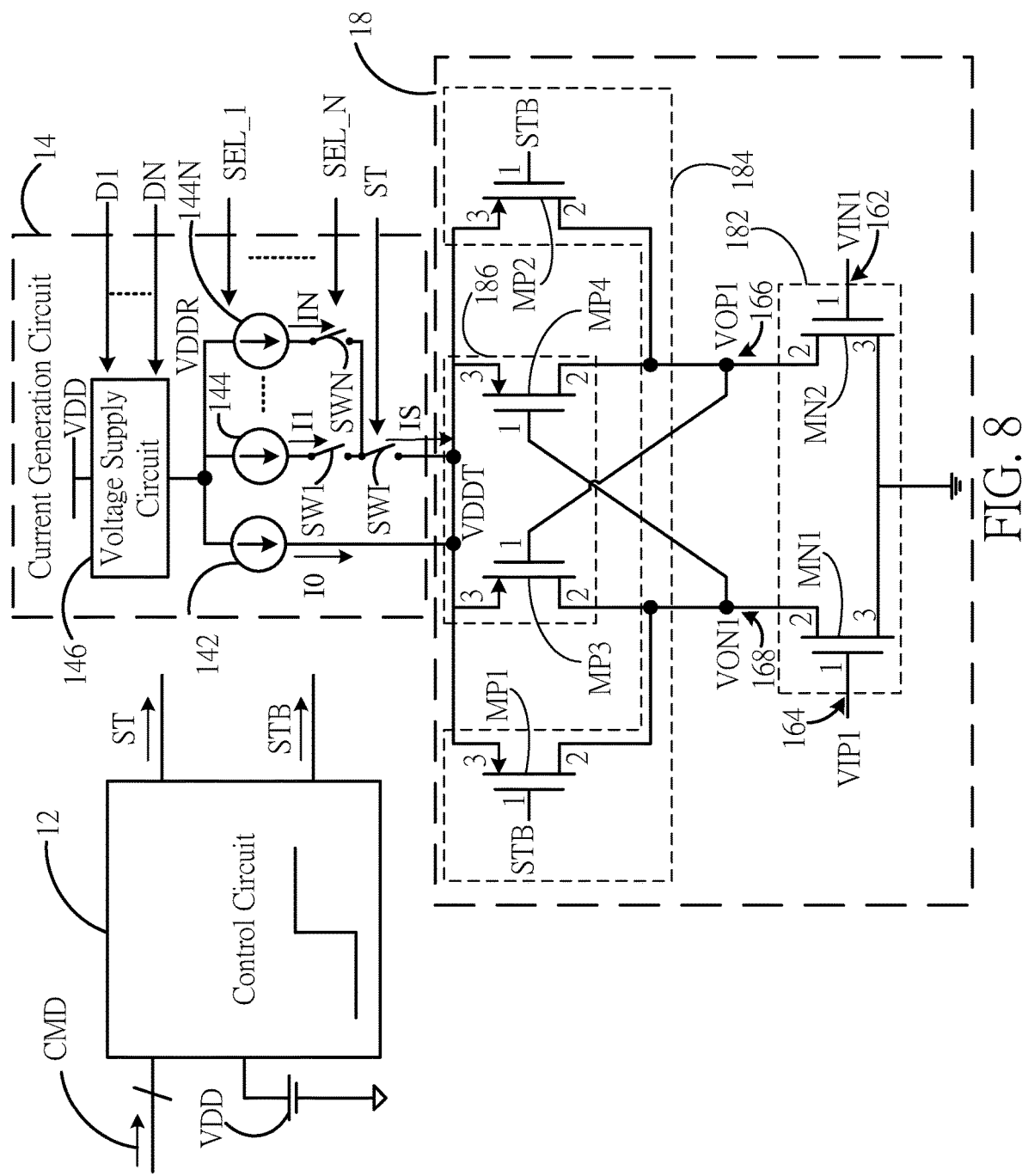
FIG. 8 shows a circuit diagram of the current generation circuit and the single delay cell according to another embodiment of the present application.

Please refer to FIG. 8, which shows a circuit diagram of the current generation circuit and a single delay cell according to another embodiment of the present application. Compared with FIG. 5, the current generation circuit 14 in FIG. 8 further comprises a voltage supplying circuit 146, which provides a regulating voltage VDDR to the first current source 142 and the second current sources 144~144N according to one or more stable signal of a plurality of voltage stabilizing signals D1~DN. The voltage supplying circuit 146 may provide fine voltage adjustment to the first current source 142 and the second current sources 144~144N so that the first current I0 and the second current I1 to the N-th current IN may be adjusted with more fineness. Accordingly, the driving voltage VDDT may be influenced by the regulating voltage VDDR.

Figure 9:
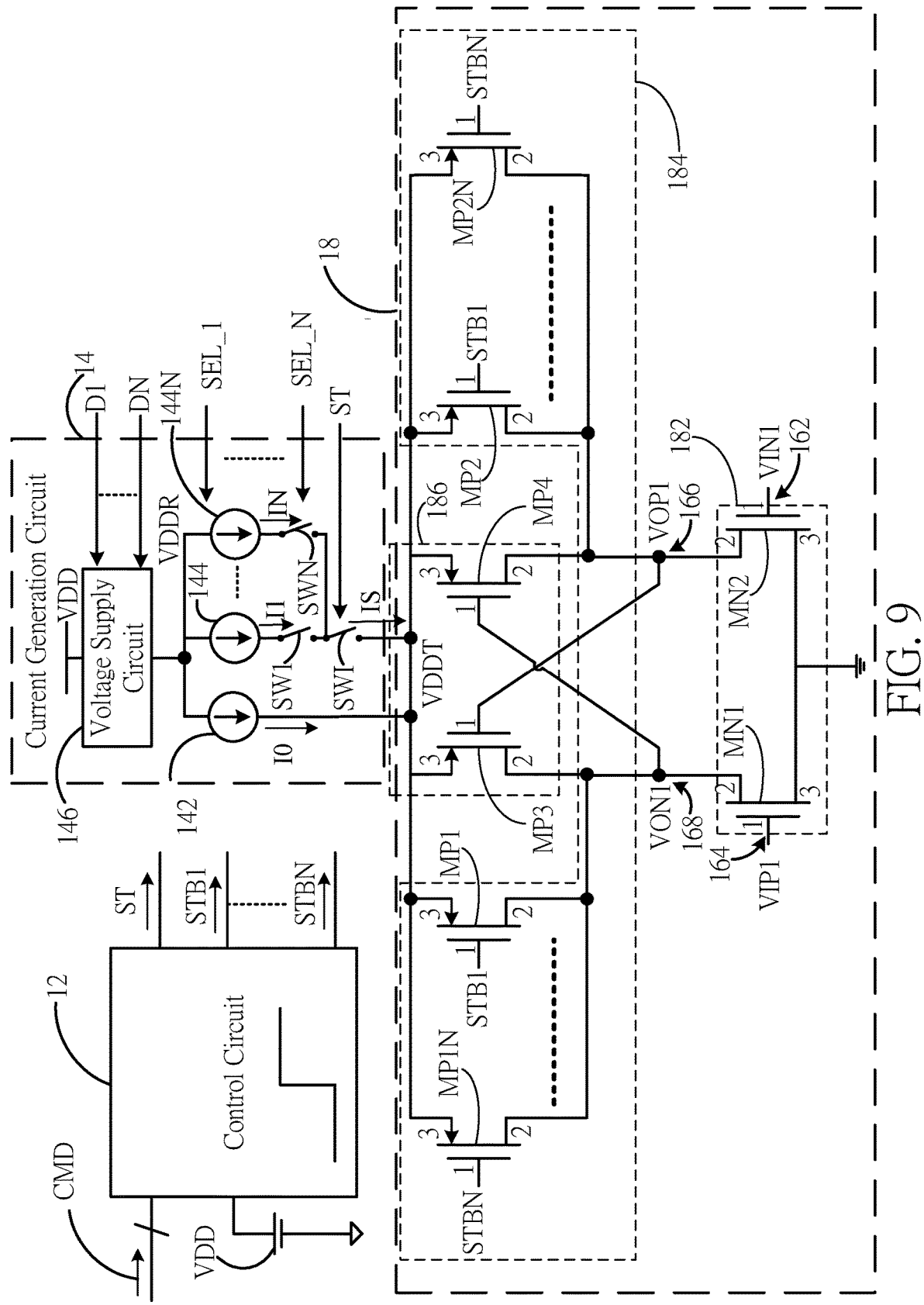
FIG. 9 shows a circuit diagram of the current generation circuit and the single delay cell according to another embodiment of the present application.

Please refer to FIG. 9, which shows a circuit diagram of the current generation circuit and a single delay cell according to another embodiment of the present application. Compared with FIG. 6, the current generation circuit 14 in FIG. 9 further comprises a voltage supplying circuit 146, which provides a regulating voltage VDDR to the first current source 142 and the second current sources 144~144N. The voltage supplying circuit 146 may provide fine voltage adjustment to the first current source 142 and the second current sources 144~144N so that the first current I0 and the second current I1 to the N-th current IN may be adjusted with more fineness. Accordingly, the driving voltage VDDT may be influenced by the regulating voltage VDDR.

Figure 10:
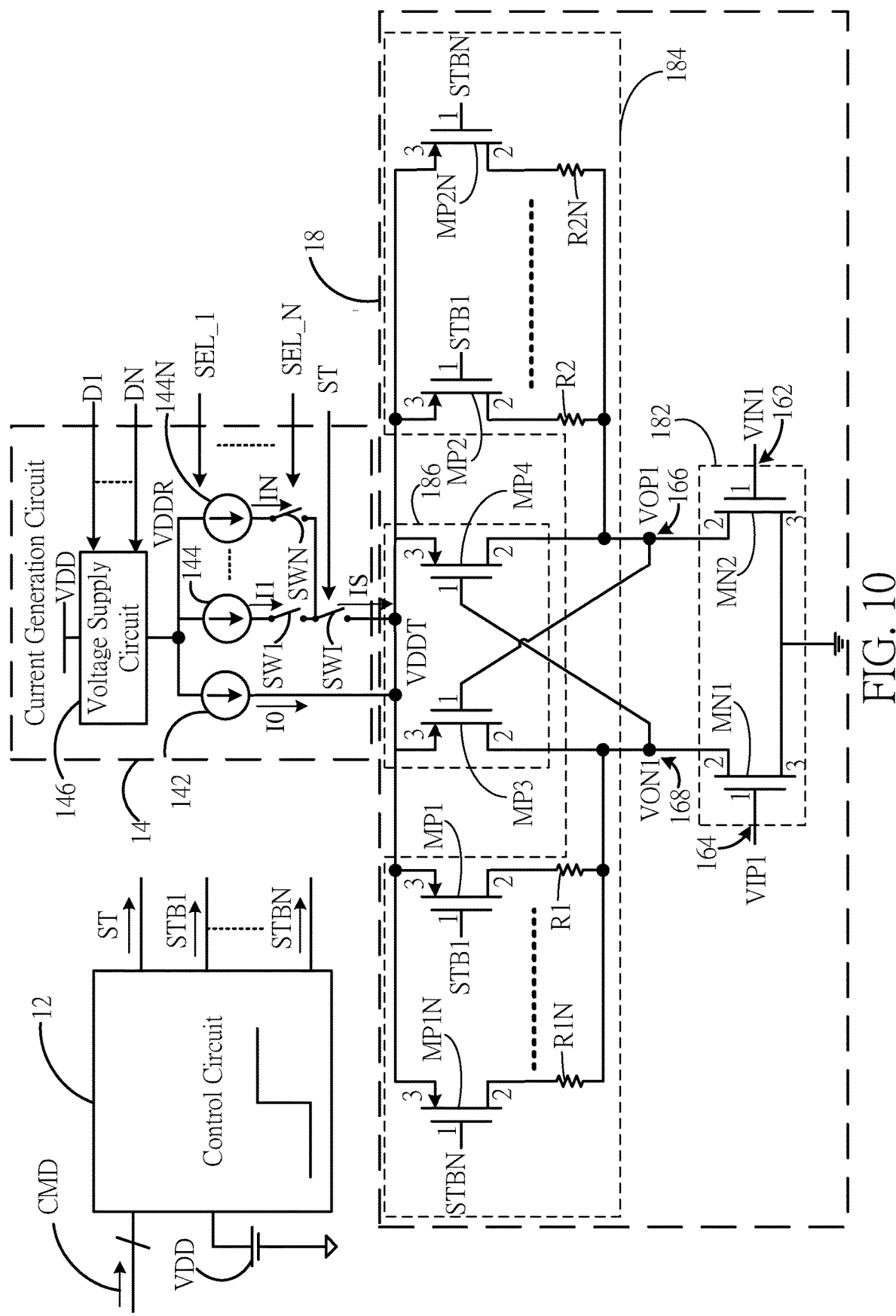
FIG. 10 shows a circuit diagram of the current generation circuit and the single delay cell according to another embodiment of the present application.

Please refer to FIG. 10, which shows a circuit diagram of the current generation circuit and a single delay cell according to another embodiment of the present application. Compared with FIG. 7, the current generation circuit 14 in FIG. 10 is further coupled to the plurality of first resistors R1~RN and the plurality of second resistors R2~R2N in series. In addition, the current generation circuit 14 in FIG. 10 further comprises a voltage supplying circuit 146, which provides a regulating voltage VDDR to the first current source 142 and the second current sources 144~144N according to one or more stable signal of a plurality of voltage stabilizing signals D1~DN. The voltage supplying circuit 146 may provide fine voltage adjustment to the first current source 142 and the second current sources 144~144N so that the first current I0 and the second current I1 to the N-th current IN may be adjusted with more fineness. Accordingly, the driving voltage VDDT may be influenced by the regulating voltage VDDR.

According to above embodiments, it is known that the control signal STB controls the turning on and off of the step-controlled pair circuit 184 for determining the impedance of the step-controlled pair circuit 184 should be coupled with the impedance of the cross couple pair 186 in parallel. Thereby, according to the present application, the control signal STB is used to change the corresponding impedance of the first output signal VOP and the second output signal VON and thus changing the signal frequency of the first output signal VOP and the second output signal VON from the first signal frequency f1 to a higher second signal frequency f2. Besides, the second current sources 144~144N of the current generation circuit 14 may change the current values of the second current I1 to the N-th current IN via the select signals SEL_1~SEL_N. Furthermore, the voltage supplying circuit 146 may change the supplied voltage for fine tuning the frequency of the first output signal VOP and the second output signal VON and thus accelerating the delay cells 18 to generate the first output signal VOP and the second output signal VON.

To sum up, the present application provides an oscillation device and the method for oscillation thereof. The present application uses a control circuit to generate a control signal, which controls a ring oscillation circuit. The ring oscillation circuit may become the frequency of an oscillation signal from a first signal frequency to a second signal frequency with the second signal frequency higher than the first signal frequency. Thereby, the oscillation device according to the present application may start oscillation at a lower first signal frequency. Next, the control signal drives the frequency of the oscillation signal to change to the second signal frequency, meaning that the oscillation frequency is higher once the oscillation is started. Consequently, the problem of the starting of oscillation may be solved according to the present application.

Accordingly, the present application conforms to the legal requirements owing to its novelty, nonobviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

The invention claimed is:

1. An oscillation device, comprising:
a control circuit, generating a control signal and coupled to a supply voltage; and
a ring oscillation circuit, coupled to said control circuit, starting oscillation at a first signal frequency from no starting oscillation and generating an oscillation signal with said first signal frequency while said supply voltage is raised to a supply voltage level, then adjusting an oscillation frequency according to said control signal for driving the frequency of said oscillation signal to become from said first signal frequency to a second signal frequency, and said second signal frequency higher than said first signal frequency.

2. The oscillation device of claim 1, wherein said control circuit generates said control signal according to said supply voltage or a control command.

3. The oscillation device of claim 1, further comprising a current generation circuit, coupled to said control circuit, generating a first current, generating a conduction current according to a current control signal of said control circuit, and said ring oscillation circuit further generating said oscillation signal according to said first current or according to said first current and said conduction current.

4. The oscillation device of claim 3, wherein said current generation circuit comprises:
a first current source, coupled to said ring oscillation circuit, and generating said first current; and
at least one second current source, coupled to said ring oscillation circuit via a current switch, generating at least one second current, and said current switch controlling transmission of said at least one second current to be said conduction current transferred to said ring oscillation circuit according to said current control signal.

5. The oscillation device of claim 4, wherein said current generation circuit further comprises a voltage supplying circuit, coupled to said first current source and said at least one second current source, and generating a regulating voltage to said first current source and said at least one second current source.

6. The oscillation device of claim 1, wherein said ring oscillation circuit comprises a plurality of delay cells with each including:
an input differential pair, coupled to a first input terminal, a second input terminal, a ground, a first output terminal, and a second output terminal;
a cross couple pair, coupled to said first output terminal and said second output terminal; and
a step-controlled pair circuit, coupled to said cross couple pair in parallel, and coupled to said control circuit, said first output terminal, and said second output terminal.

7. The oscillation device of claim 6, wherein said step-controlled pair circuit comprises a plurality of step-controlled pairs, coupled to said control circuit, coupled to said cross couple pair in parallel, and connected in parallel with other step-controlled pairs.

8. The oscillation device of claim 7, wherein said step-controlled pair circuit further comprises a plurality of resistors, coupled in series with said plurality of step-controlled pairs.

9. A method for oscillation of an oscillation device, comprising:
driving a ring oscillation circuit to start oscillation at a first signal frequency from no starting oscillation and generate an oscillation signal with said first signal frequency while a supply voltage is supplied to a control circuit and raised to a supply voltage level; and
driving said ring oscillation circuit to adjust an oscillation frequency according to a control signal from said control circuit for driving the frequency of said oscillation signal to become from said first signal frequency to a second signal frequency, and said second signal frequency higher than said first signal frequency.

10. The method for oscillation of the oscillation device of claim 9, wherein said step of driving said ring oscillation circuit to adjust an oscillation frequency for driving the frequency of said oscillation signal to become from said first signal frequency to a second signal frequency, said ring oscillation circuit adjusts a circuit impedance, a driving voltage, or a driving current of said ring oscillation circuit for driving the frequency of said oscillation signal to become from said first signal frequency to said second signal frequency.

\* \* \* \* \*